United States Patent [19]

Namae

[11] 4,199,681
[45] Apr. 22, 1980

[54] METHOD AND APPARATUS FOR AUTOMATICALLY FOCUSING AN ELECTRON BEAM IN A SCANNING BEAM DEVICE

[75] Inventor: Takao Namae, Tokyo, Japan

[73] Assignee: Nihon Denshi Kabushiki Kaisha, Tokyo, Japan

[21] Appl. No.: 949,430

[22] Filed: Oct. 10, 1978

[30] Foreign Application Priority Data

Oct. 18, 1977 [JP] Japan .................................. 52-124791

[51] Int. Cl.$^2$ .......................................... G01M 23/00
[52] U.S. Cl. ................................. 250/311; 250/396 R
[58] Field of Search ................................ 250/311, 396

[56] References Cited

U.S. PATENT DOCUMENTS

| 3,748,467 | 7/1973 | Suganuma | 250/311 |
| 3,937,959 | 2/1976 | Namae | 250/311 |
| 3,942,005 | 3/1976 | Watanabe | 250/311 |
| 4,045,669 | 8/1977 | Kamimura | 250/311 |

*Primary Examiner*—Harold A. Dixon
*Attorney, Agent, or Firm*—Webb, Burden, Robinson & Webb

[57] ABSTRACT

An electron beam device comprising a scanning means for automatically focusing said electron beam and a related method. The scanning means is controlled at all times to operate under optimum magnification and scanning speed conditions.

3 Claims, 12 Drawing Figures

Fig.1
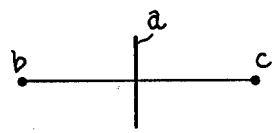
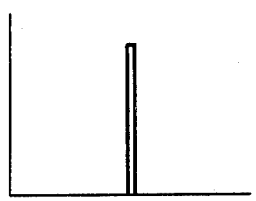
Fig.2(a)
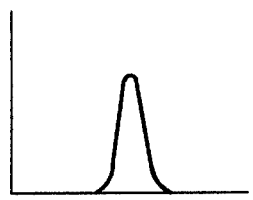
Fig.2(b)
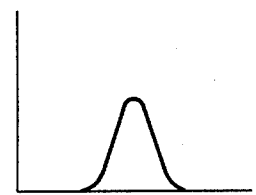
Fig.2(c)
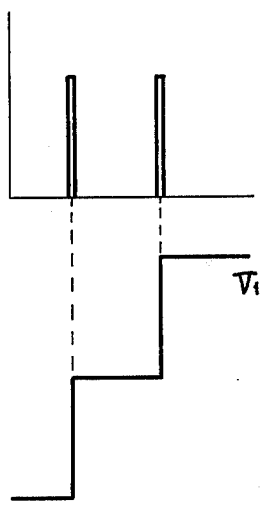
Fig.3(a)
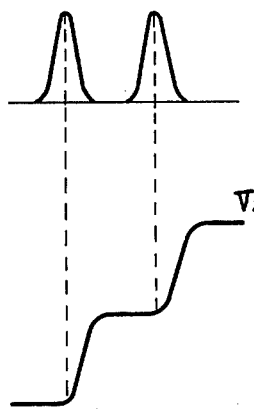
Fig.3(b)
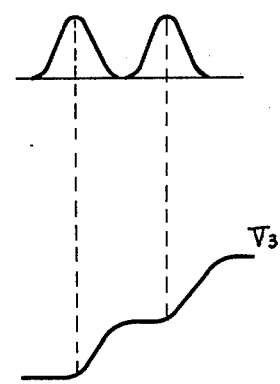
Fig.3(c)

METHOD AND APPARATUS FOR AUTOMATICALLY FOCUSING AN ELECTRON BEAM IN A SCANNING BEAM DEVICE

BACKGROUND

This invention relates to a method and apparatus for automatically focusing an electron beam in a scanning electron microscope or other apparatus having an electron optical system.

It is well known that in order to obtain a high resolution image when using a scanning electron microscope, etc., it is necessary to irradiate the specimen with an electron beam having a very fine spot diameter. In order to do this, in other words in order to focus the electron beam, the operator must adjust the focal length of the condenser lens in accordance with his own visual assessment of the microscope image, an operation which is extermely exacting and time consuming especially for a person untrained in this type of adjustment.

In recent times, concerted efforts have been made to automate the above focusing operation. One such proposed automatic focusing method and apparatus is disclosed in my U.S. Pat. No. 3,937,959, entitled "Method and Apparatus for Automatically Focusing", said method and apparatus being used in an electron beam scanning device incorporating an electron beam generating source, a condenser lens system for focusing the electron beam generated by said source on a specimen, a scanning means for scanning the electron over said specimen, a detecting means for detecting the signal emanating from said specimen resultant upon electron beam irradiation, and a display means for displaying the specimen image on a display device by using the output signal of said detecting means to modulate the scanning beam of the display device which is in synchronism with said scanning means.

The automatic focusing method disclosed in said U.S. Pat. No. 3,937,959 comprises the following steps:

(a) changing the condenser lens focal length stepwise in synchronism with said scanning means, (b) converting the output of said detecting means into a signal indicative of and corresponding to the diameter of said electron beam, (c) comparing two converting signals indicative of the beam diameter obtained in step (b) and, (d) controlling the polarity and change width in step (a) in response to the result obtained in step (c) in order to minimize the beam diameter.

Moreover, in the automatic focusing method as disclosed in said patent, the amplitude and periodicity of the scanning means is kept constant during each automatic focusing operation. Such being the case, when carrying out high magnification image observation, steps (a) and (c) above may not be executed with sufficient accuracy. For example, if the amplitude and periodicity of the scanning means is kept constant at let's say an image magnification in the order of $1 \times 10^4$ times (length of specimen area scanned by electron beam is $10 \sim 15\mu$, CRT screen width is $10 \sim 15$ cm) and the amount of electron beam defocus exceeds $10\mu$, it will be impossible to automatically produce a signal indicative of the diameter of the electron beam. Accordingly, it is necessary to manually set the magnification of the scanning means to some low value and to then gradually increase the magnification upon completion of each automatic focusing operation until the desired magnification is reached.

Again, if the scanning speed is too high, the converted signal in step (b) will not accurately accord with the diameter of the electron beam. On the other hand, if the scanning speed is too low, the automatic focusing opertion becomes protracted. Accordingly, it is necessary to manually set the scanning speed of the scanning means appropriately prior to the commencement of the automatic focusing operation.

The object, therefore, of the subject invention is to provide an automatic focusing method in which the scanning means operates under optimum conditions, with respect to magnification and scanning speed, at all times.

SUMMARY OF THE INVENTION

Briefly, according to this invention, the scanning beam device is provided with a scanning control means for controlling the scanning speed and scanning signal magnitude of the output scanning signal of the scanning means. This scanning control means is activated during automatic focusing so as to maintain the scanning condition at optimum for automatic focusing.

THE DRAWINGS

FIGS. 1, 2a, 2b, 2c, 3a, 3b, and 3c are schematic drawings for explaining the relation between the electron beam diameter and the waveforms of the video signal detected from the specimen, FIG. 4 is a schematic drawing showing one embodiment according to this invention, FIGS. 5a, 5b and 5c are schematic diagrams for explaining the principle of operation of the embodiment shown in FIG. 4, and FIG. 6 is a schematic drawing showing the scanning signal generator 7 in greater detail.

DESCRIPTION OF THE PREFERRED EMBODIMENTS

In FIG. 1, "a" indicates the line area where the quantity of the generated signal is "1"; elsewhere, the quantity of the generated signal is assumed to be "0". FIG. 2 shows three beam spot diameters and their respective detection signals when the electron beam is made to scan an object from point b towards point c shown in FIG. 1. It is apparent from FIG. 2(a), (b) and (c) that the smallest electron beam spot diameter produces the sharpest signal having the greatest amplitude and that, as the beam spot diameter increases, the signal shows a marked tendency to flatten out. Accordingly, if there are two or more signals and their amplitude variations are accumulated, the accumulation values V1, V2 and V3 shown in FIG. 3(a), (b) and (c), respectively are obtained. Moreover, if these values are compared, the relationship $V1 > V2 > V3$ is established. That it to say, since the accumulation value is maximum when the electron beam is in focus, automatic focusing can be achieved by comparing the accumulation value at a certain focal length of the condenser lens with the accumulation value at a slightly different focal length and controlling the lens excitation current so as to maximize said compared accumulation value.

Figure 4:
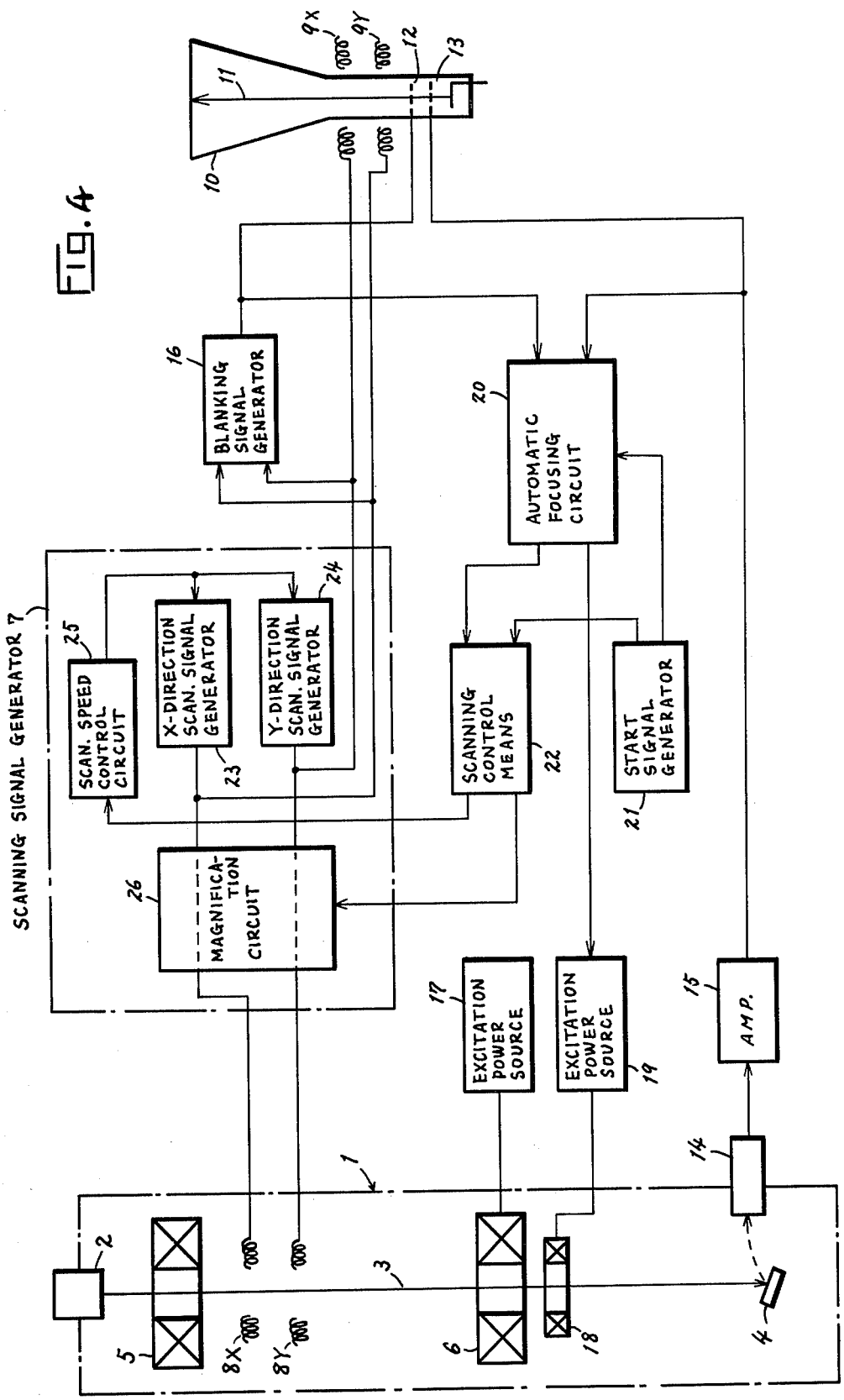

FIG. 4 shows one embodiment of a scanning electron microscope according to this invention. In the figure, a microscope column 1 houses an electron optical system comprising an electron gun 2 for producing an electron beam 3 which irradiates a specimen 4, a first condenser lens 5 and a second condenser lens (de facto objective lens) 6, etc. A scanning signal generator 7, composed of an X-direction (horizontal) scanning signal generator 23, a Y-direction (vertical) scanning signal generator 24, a scanning speed control circuit 25 and a magnification circuit 26 for varying the amplitude of the output signals of the scanning signal generators 23 and 24, supplies scanning signals to scanning coils 8X and 8Y so as to make the electron beam 2 scan the surface of the specimen 4 two-dimensionally. Simultaneously, the scanning signal generator 7 supplies signals to scanning coils 9X and 9Y forming part of the CRT 10 so as to scan an electron beam 11 over the CRT screen. The intensity of said electron beam is modulated by the varying potential of control grids 12 and 13 and the specimen image is displayed on the CRT screen in accordance with the secondary electrons, X-rays, etc. emanating from the specimen due to electron beam irradiation, said electrons, etc. being detected by a detector 14 and amplified by an amplifier 15 prior to being impressed as an electrical signal on control grid 13. The signal applied to control grid 12 is supplied by a blanking signal generator 16 which is synchronized with the output of the generator 7, the purpose of said signal being to maintain the CRT brightness at the zero level during the so called blanking period; i.e., the retrace time of the multiple X-direction (direct line) scanning. In the apparatus thus far described, the specimen image is focused by adjusting the excitation current power source 17 of the condenser lens 6. By adding another small auxiliary lens 18, complete with excitation current power source 19, however, and by locating said auxiliary lens near the condenser lens 6, the specimen image can be focused both automatically and precisely. This type of automatic and precise focusing control is achieved with the aid of an automatic focusing circuit 20 which supplies a control signal to the excitation current power source 19 in accordance with the video signal outputted from the detector 14 and the electron beam scanning blanking signal.

Figure 5:
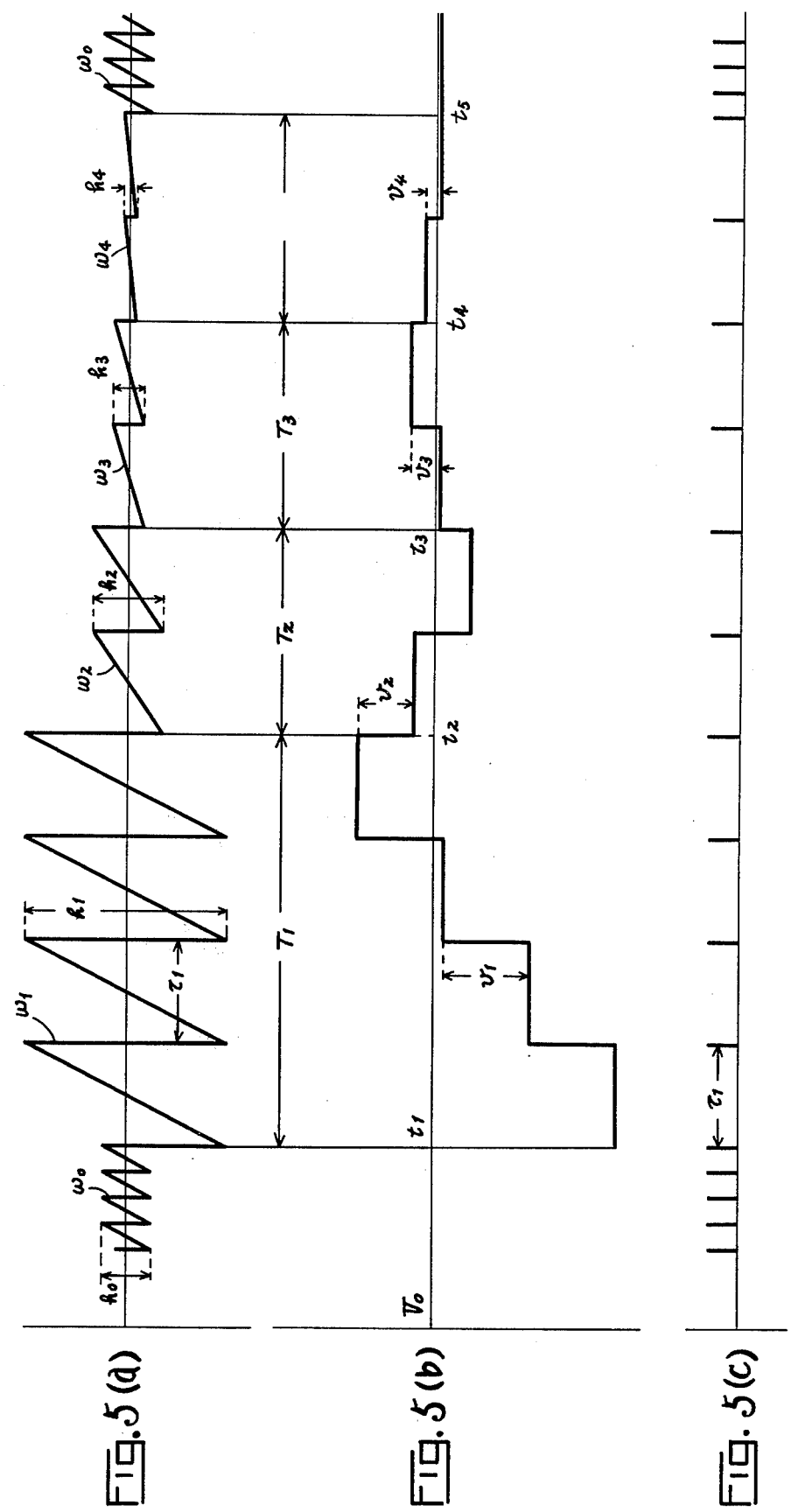

In the embodiment shown in FIG. 4, a start signal generator 21 generates a start signal for starting the automatic focusing circuit 20 and a scanning control means 22. The automatic focusing circuit 20 generates a stepwise signal as shown in FIG. 5(b) in order to vary the output of the excitation power source 19 synchronously with the blanking signal from the blanking signal generator 16, as shown in FIG. 5(c)., and convert the detected specimen signal into a D.C. signal corresponding to the diameter of the electron beam during the periods between each blanking signal. Two successive converted signals for detecting the condition under which the stepwise control signal crosses the optimum signal level $V_o$ are then compared, and the increasing and decreasing polarity is reversed and the step widths $v_1$, $v_2$, $v_3$, $v_4$ of the signal shown in FIG. 5(b) are changed. Moreover, when the stepwise control signal with the minimum step width $v_4$ crosses the optimum (correct focusing) signal level $V_o$, the automatic focusing circuit 20 stops operating and locks the control signal value applied to the exciting power source 19 (for further details on the automatic focusing circuit 20, refer to my U.S. Pat. No. 3,937,959).

Figure 6:
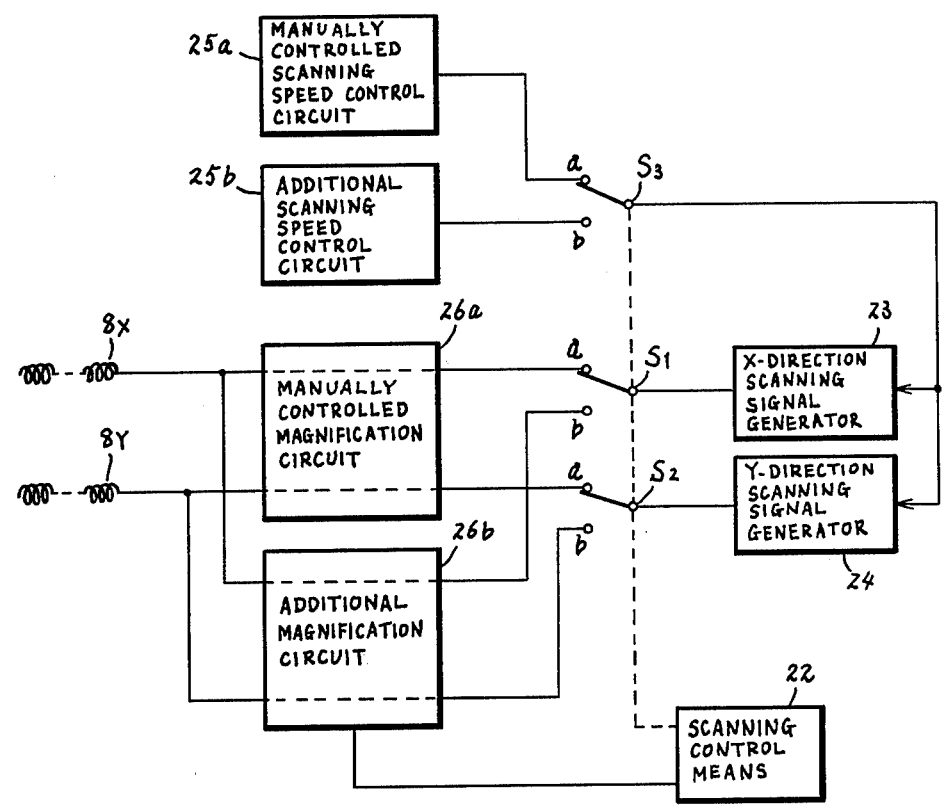

FIG. 6 shows the scanning signal generator 7 in greater detail. It will be noted that magnification circuit 26 comprises a manually controlled magnification circuit 26a, an additional magnification circuit 26b and the changeover switches $S_1$ and $S_2$, and the scanning speed control circuit 25 comprises a manually controlled scanning speed control circuit 25a and an additional scanning speed control circuit 25b, complete with changeover switch $S_3$.

FIG. 5(a) shows that the X-direction scanning output signal $w_o$ is set manually prior to time $t_1$ when the automatic focusing control device comes into operation. Moreover, the scanning height $h_o$ of the signal $w_o$ is unsuitable for carrying out automatic focusing. In this condition, the start signal generator 21 supplies signals at time $t_1$ to the automatic focusing circuit 20 and the scanning control means 22 which controls the additional magnification circuit 26b and switches $S_1$, $S_2$ and $S_3$ so as to changeover the connecting rods from terminals "a" to "b". Consequently, a scanning signal $w_1$ having a scanning period $\tau_1$ and a scanning signal height $h_1$ is produced by the additional magnification circuit 26b and the additional scanning speed control circuit 25b at the time $t_1$. At the same time, the start signal generator 21 generates a start signal so as to activate the automatic focusing circuit 20 and thereby produce the stepped control signal shown in FIG. 5(b). This control signal varies by amount $v_1$ every blanking signal until the control signal value surpasses the optimum signal level $V_o$, namely during the period $T_1$ (from $t_1$ to $t_2$).

At time $t_2$, the automatic focusing circuit 20 supplies another signal to the scanning control means 22 which, in turn, supplies a control signal to the additional magnification control circuit 26b, thereby producing a changed X-direction scanning signal $w_2$ having a signal height $h_2$ ($<h_1$) as shown in FIG. 5(a). Moreover, during the period $T_2$ (from $t_2$ to $t_3$), the stepped signal generated by the automatic focusing circuit 20 decreases by the amount $v_2$ ($<v_1$) every blanking signal up to time $t_3$.

Similarly, during period $T_3$, the stepped control signal increases in the amount $v_3$ ($<v_2$) and a scanning signal $w_3$ having a signal height $h_3$ ($<h_2$) is produced by the additional magnification circuit 26b controlled by the scanning control means 22 and the automatic focusing circuit 20. Moreover during period $T_4$, the stepped control signal decreases by the amount $v_4$ ($<v_3$) is generated and a scanning signal $w_4$ having a signal height $h_4$ ($<h_3$) is produced by the additional magnification circuit 26b controlled by the scanning control means 22 and the automatic focusing circuit 20. At the end of period $T_4$, the automatic focusing circuit 20 locks the output signal level and applies a finish signal to the scanning control means 22. By so doing, the scanning control means 22 generates and supplies changeover signals to changeover switches $S_1$, $S_2$, $S_3$ so as to changeover the connecting rods from terminals "b" to "a". As a result, the scanning signal $w_o$ is again outputted from the scanning signal generator 7 by the manually controlled magnification circuit 26a and the manually controlled scanning speed circuit 25a. In the above description, the Y-direction scanning signal height is maintained at some fixed value (e.g., zero level) or varied slightly during automatic focusing by the additional scanning magnification circuit 26b.

Suffice to say, this invention is not restricted to the embodiment as heretofore described. For example, in FIG. 5, it is possible to terminate automatic focusing at $t_4$, because the scanning signal height $h_3$ is smaller than ($h_o$) of the scanning signal $w_o$. Further, it is possible to change the scanning magnification (viz. the signal height of the X-direction scanning signal) upon completion of each automatic focusing procedure (period $T_1 \sim T_4$), thereby enabling the automatic focusing procedure to be carried out during high magnification image observation.

Having thus described my invention with the detail and particularity as required by the Patent laws, what is desired protected by Letters Patent is set forth in the following claims.

I claim:

1. A method for automatically focusing an electron beam on a specimen using a scanning device having an electron beam source, a condenser lens system for focusing the electron beam on the specimen, a scanning means for scanning the electron beam over the specimen, a detecting means for detecting the signal emanating from the specimen resultant upon electron beam irradiation, and a display means for displaying the specimen image on a display device by using the output signal of said detecting means to modulate the scanning beam of the display device which is in synchronism with said scanning means, said method comprising the steps for:
   (a) repeatedly changing the condenser lens system focal length stepwise in synchronism with said scanning means,
   (b) converting the output of said detecting means into a signal corresponding to the diameter of said electron beam during a time interval between each stepwise change of focal length,
   (c) comparing two successive signals obtained in step (b),
   (d) controlling the polarity and size of the change in focal length in step (a) according to the result obtained in step (c),
   (e) maintaining a constant scanning speed during the execution of steps (a) and (b), and
   (f) stepwise reducing the scanning area irradiated by the electron beam in synchronism with a change in polarity of the stepwise change in said beam diameter.

2. An electron beam scanning device comprising:
   an electron beam source,
   a condenser lens system for focusing the electron beam on a specimen
   a scanning means for scanning the electron beam over the specimen two-dimensionally, wherein the beam is rapidly swept back and forth in one direction, namely the X-direction, and slowly moved in a perpendicular direction, namely the Y-direction, to irradiate an area of the specimen,
   a means for detecting the signal emanating from the specimen resultant upon electron beam irradiation,
   a display means for displaying the specimen image on a display device by using the output signal of said detecting means to modulate the scanning beam of the display device which is in synchronism with said scanning means, and
   an automatic focusing device comprising
      means for changing the focal length of said condenser lens system stepwise in synchronism with said scanning means,
      means for converting the output of said detecting means into a signal indicative of the diameter of said electron beam during a time interval at each focal length,
      means for comparing two successive signals indicative of said beam diameter, and
      means for changing the polarity and width of the stepwise change in said beam diameter in response to the result of said comparison in order to minimize the beam diameter,
   the improvement comprising a scanning control means associated with said scanning means for maintaining the scanning speed constant, and stepwise reducing the specimen area irradiated by the electron beam in synchronism with a change in polarity of the stepwise change in said beam diameter during the operation of said automatic focusing device.

3. An electron beam scanning device as claimed in claim 2, wherein said scanning control means stepwise reduces the specimen area scanned by the electron beam by reducing the extent of the scan in the X-direction from wide to narrow, and maintains the extent of the scan in the Y-direction in order to preset a constant position during the opertion of said automatic focusing device.

* * * * *